United States Patent
Dosho et al.

(10) Patent No.: US 8,896,477 B2
(45) Date of Patent: Nov. 25, 2014

(54) TIME-TO-DIGITAL CONVERTER (71) Applicant: Panasonic Corporation, Osaka (JP)

(72) Inventors: Shiro Dosho, Osaka (JP); Masao Takayama, Hyogo (JP)

(73) Assignee: Panasonic Corporation, Osaka (JP)

(*) Notice: Subject to any disclaimer, the term of this patent is extended or adjusted under 35 U.S.C. 154(b) by 0 days.

(21) Appl. No.: 14/265,148

(22) Filed: Apr. 29, 2014

(65) Prior Publication Data
US 2014/0320329 A1    Oct. 30, 2014

Related U.S. Application Data (63) Continuation of application No. PCT/JP2012/004241, filed on Jun. 29, 2012.

(30) Foreign Application Priority Data

Nov. 10, 2011 (JP) ................................ 2011-246701

(51) Int. Cl.
  *H03M 1/50* (2006.01)
  *G04F 10/00* (2006.01)
  *H03M 1/18* (2006.01)
  H03M 1/12 (2006.01)
  H03L 7/087 (2006.01)
  H03M 1/00 (2006.01)
  H03L 7/081 (2006.01)
  H03L 7/18 (2006.01)

(52) U.S. Cl.
  CPC .............. *G04F 10/005* (2013.01); *H03M 1/18* (2013.01); *H03M 2201/4233* (2013.01); *H03M 1/12* (2013.01); *H03L 7/087* (2013.01); *H03M 1/00* (2013.01); *H03L 7/0814* (2013.01); *H03L 7/18* (2013.01)
  USPC ........................................... 341/166; 341/155

(58) Field of Classification Search
  CPC . H03M 2201/4233; H03M 1/00; H03M 1/12; H03M 1/18; H03L 7/18; H03L 7/0814; H03L 7/087; G04F 10/005

USPC .......... 341/166, 155, 156; 327/158, 159, 147; 375/376

See application file for complete search history.

(56) References Cited

U.S. PATENT DOCUMENTS

| 5,128,624 | A | 7/1992 | Hoshino et al. |
| 5,289,135 | A | 2/1994 | Hoshino et al. |
| 5,568,071 | A | 10/1996 | Hoshino et al. |
| 2012/0092052 | A1* | 4/2012 | Matsuda ...................... 327/158 |

FOREIGN PATENT DOCUMENTS

| JP | 61-227422 A | 10/1986 |
| JP | 3-220814 A | 9/1991 |
| JP | 06-283984 A | 10/1994 |

OTHER PUBLICATIONS

International Search Report issued in International Application No. PCT/JP2012/004241 mailed Aug. 14, 2012, with English translation, 3 pgs.

* cited by examiner

*Primary Examiner* — Joseph Lauture
(74) *Attorney, Agent, or Firm* — McDermott Will & Emery LLP (57) ABSTRACT

An edge detector includes flip-flops receiving phase signals of a ring oscillator, a resetter canceling the reset states of the flip-flops at the edge timing of an input signal, and a logical operator performing a logical operation on output signals of the flip-flops. A phase state detector detects a phase state of the ring oscillator occurring at the edge timing of the input signal based on the output signals of the flip-flops. A time-to-digital converter converts an edge interval between the input signal and an output signal of the logical operator into a digital value. A latch latches a value of a counter counting the number of cycles of an output signal of the ring oscillator, at the edge timing of the input signal. An operator calculates a digital value of a received signal from output signals of the latch, the phase state detector, and the time-to-digital converter.

5 Claims, 10 Drawing Sheets

TIME-TO-DIGITAL CONVERTER

CROSS-REFERENCE TO RELATED APPLICATIONS

This is a continuation of International Application No. PCT/JP2012/004241 filed on Jun. 29, 2012, which claims priority to Japanese Patent Application No. 2011-246701 filed on Nov. 10, 2011. The entire disclosures of these applications are incorporated by reference herein.

BACKGROUND

The present disclosure relates to time-to-digital converters which digitize analog temporal information.

Advances in digital phase-locked loop circuits have in recent years lead to an extensive development of time-to-digital converters. A typical time-to-digital converter includes a ring oscillator and a latch circuit. A preceding input signal is allowed to propagate in a ring oscillator, and each phase signal in the ring oscillator is latched using a following input signal, and the latched phase state is output as a digital value corresponding to a time interval between edges of the input signals.

When a time-to-digital converter is applied to a time interval analyzer etc., the time-to-digital converter is required to be able to measure a longer time difference. If the period of the ring oscillator is extended in order to meet the requirement, the circuit scale significantly increases. Therefore, a counter which counts the number of cycles of the output signal of the ring oscillator may be added to the time-to-digital converter to extend the measurement range without an increase in circuit scale or a reduction in detection accuracy (see, for example, Japanese Unexamined Patent Publication No. H03-220814).

There is also a demand for a time-to-digital converter having an improved resolution of digital conversion in addition to the extended measurement range. In the above conventional technique, while the measurement range can be extended without an increase in circuit scale, the resolution is no higher than the inverter delay of the ring oscillator, i.e., is not sufficient. Therefore, there is a need for a time-to-digital converter which simultaneously has a wide measurement range and a high resolution.

SUMMARY

According to an aspect of the present disclosure, for example, a time-to-digital converter for converting an edge interval of an input signal into a digital value, includes a ring oscillator, an edge detection unit including a plurality of flip-flop units configured to receive a plurality of phase signals, respectively, obtained by equally dividing the oscillation period of the ring oscillator, at the respective clock input terminals thereof, a reset unit configured to cancel reset states of the plurality of flip-flop units at the timing of an edge of the input signal and reset the plurality of flip-flop units thereafter, and a logical operation unit configured to perform a logical operation on output signals of the plurality of flip-flop units, a phase state detection unit configured to detect a phase state of the ring oscillator occurring at the timing of the edge of the input signal based on the output signals of the plurality of flip-flop units, a time-to-digital conversion unit configured to convert an edge interval between the input signal and an output signal of the logical operation unit into a digital value, a counter unit configured to count the number of cycles of an output signal of the ring oscillator, a latch unit configured to latch a count value of the counter unit at the timing of the edge of the input signal, and an operation unit configured to calculate a first and a second digital value each containing an output signal of the latch unit in more significant bits, an output signal of the phase state detection unit in intermediate significant bits, and an output signal of the time-to-digital conversion unit in less significant bits, for a first and a second input signal, respectively, successively input to the time-to-digital converter, and calculate a difference between the digital values.

Therefore, a wide measurement range can be achieved by the counter unit and the latch unit. Also, the edge detection unit detects the edge of one of the phase signals which occurs at the earliest after the timing of the edge of the input signal, and then the time-to-digital conversion unit converts a time difference between the earliest edge and the edge of the input signal into a digital value. In other words, the time-to-digital conversion unit converts time information shorter than the inverter delay of the ring oscillator into a digital value, resulting in an improvement in resolution.

The time-to-digital converter may further include an even-numbered and an odd-numbered phase measurement unit each including the edge detection unit, the phase state detection unit, the time-to-digital conversion unit, the counter unit, and the latch unit. Phase signals having even-numbered phases of the ring oscillator may be input to the respective corresponding clock input terminals of the plurality of flip-flop units of the edge detection unit included in the even-numbered phase measurement unit. Phase signals having odd-numbered phases of the ring oscillator may be input to the respective corresponding clock input terminals of the plurality of flip-flop units of the edge detection unit included in the odd-numbered phase measurement unit. The counter units included in the even-numbered and odd-numbered phase measurement units may count the numbers of cycles of phase signals having different phases of the ring oscillator. The operation unit may calculate the first and second digital values by selectively using signals output from the even-numbered phase measurement unit and signals output from the odd-numbered phase measurement unit.

The time-to-digital converter may further include a first and a second phase measurement unit each including the edge detection unit, the phase state detection unit, the time-to-digital conversion unit, the counter unit, and the latch unit, and configured to receive the first and second input signals, respectively. The operation unit may calculate the first digital value from signals output from the first phase measurement unit, and the second digital value from signals output from the second phase measurement unit.

The time-to-digital converter may further include a first and a second phase measurement unit each including the even-numbered and odd-numbered phase measurement units, and configured to receive the first and second input signals, respectively. The operation unit may calculate the first digital value by selectively using signals output from the even-numbered phase measurement unit included in the first phase measurement unit and signals output from the odd-numbered phase measurement unit included in the first phase measurement unit, and calculate the second digital value by selectively using signals output from the even-numbered phase measurement unit included in the second phase measurement unit and signals output from the odd-numbered phase measurement unit included in the second phase measurement unit.

The ring oscillator may be a voltage-controlled oscillator of a phase-locked loop (PLL).

DETAILED DESCRIPTION

Embodiments of the present disclosure will now be described with reference to the accompanying drawings.

First Embodiment

Figure 1:
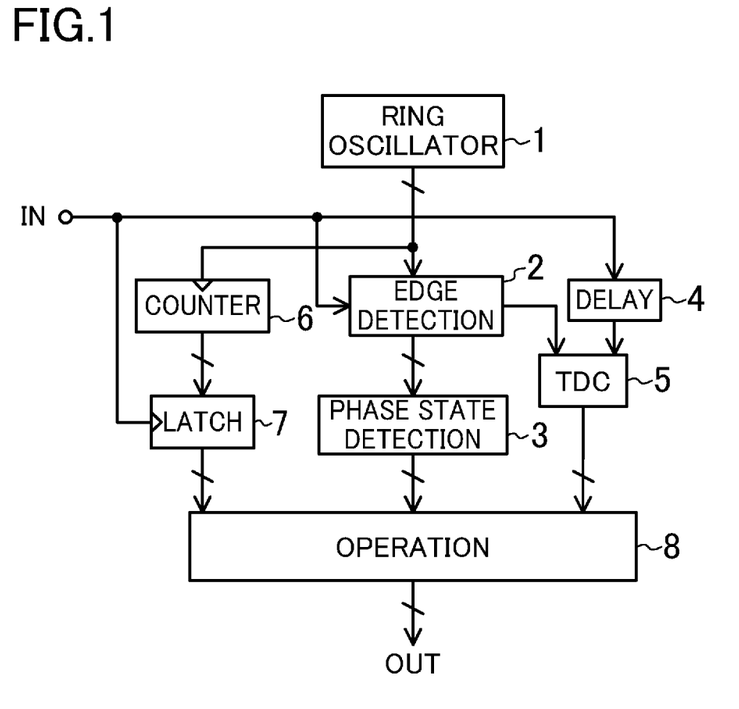
FIG. 1 is a diagram showing a configuration of a time-to-digital converter according to a first embodiment.

FIG. 1 shows a configuration of a time-to-digital converter according to a first embodiment. The time-to-digital converter of this embodiment includes a ring oscillator 1, an edge detection unit 2, a phase state detection unit 3, a delay unit 4, a time-to-digital conversion unit (TDC) 5, a counter unit 6, a latch unit 7, and an operation unit 8. The time-to-digital converter of this embodiment converts a time interval between edges (hereinafter referred to as an "edge interval") of signals IN which are input successively or at different times into a digital value, and outputs the digital value OUT. The signal IN may have either a positive or negative logical value. In the description that follows, the signal IN is assumed to be a positive logical signal for the sake of convenience. When the signal IN is a negative logical signal, the configuration described below may be suitably modified.

The ring oscillator 1 includes a plurality of delay elements (not shown) which are connected together in the shape of a ring. The delay element may be a NOT gate, a differential input/output amplifier, etc. For example, when a differential input/output amplifier is employed, the ring oscillator 1 may be configured by connecting the differential output of one amplifier to the differential input of the other amplifier, where the differential output of one amplifier is inverted before being input to the differential input of the other amplifier. The delay elements of the ring oscillator 1 output respective phase signals of the ring oscillator 1. These phase signals represent phases which are obtained by equally dividing the oscillation period of the ring oscillator 1.

Figure 2:
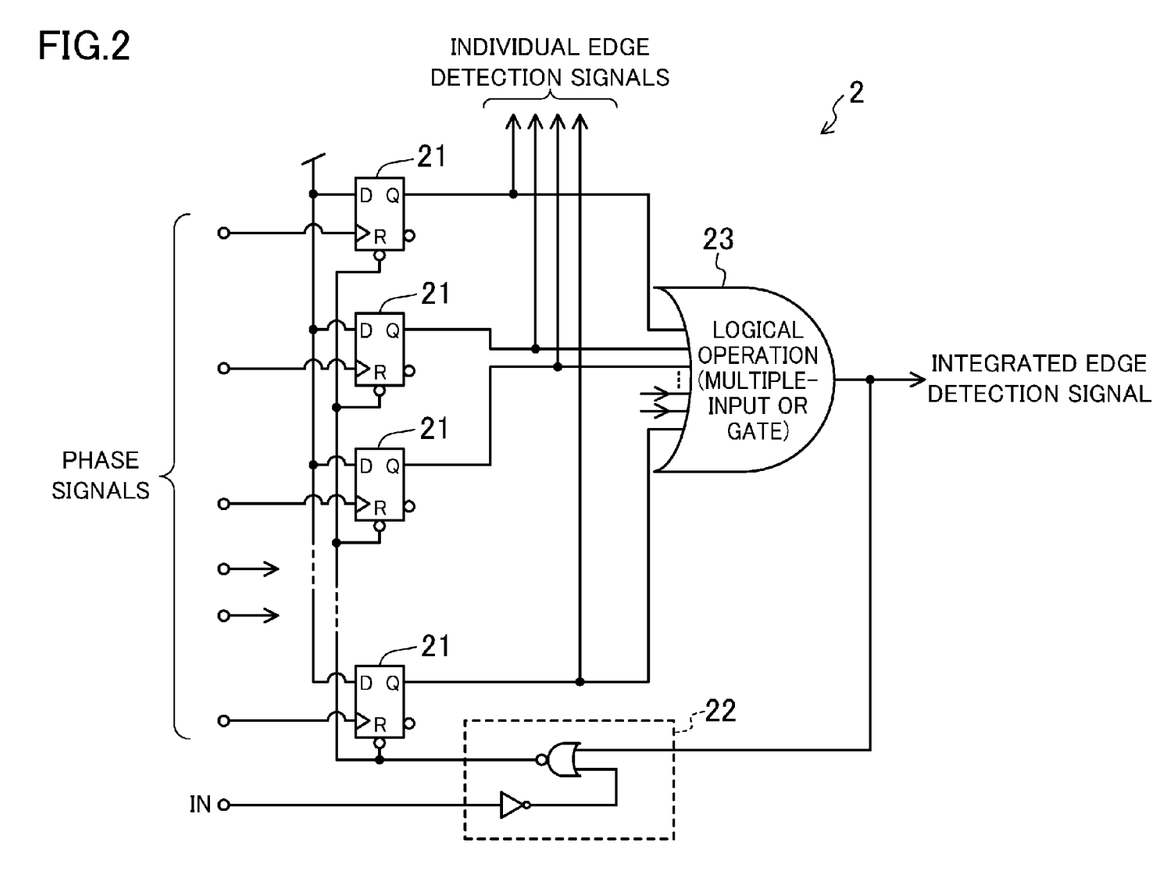
FIG. 2 is a diagram showing a configuration of an example edge detection unit.
Figure 3:
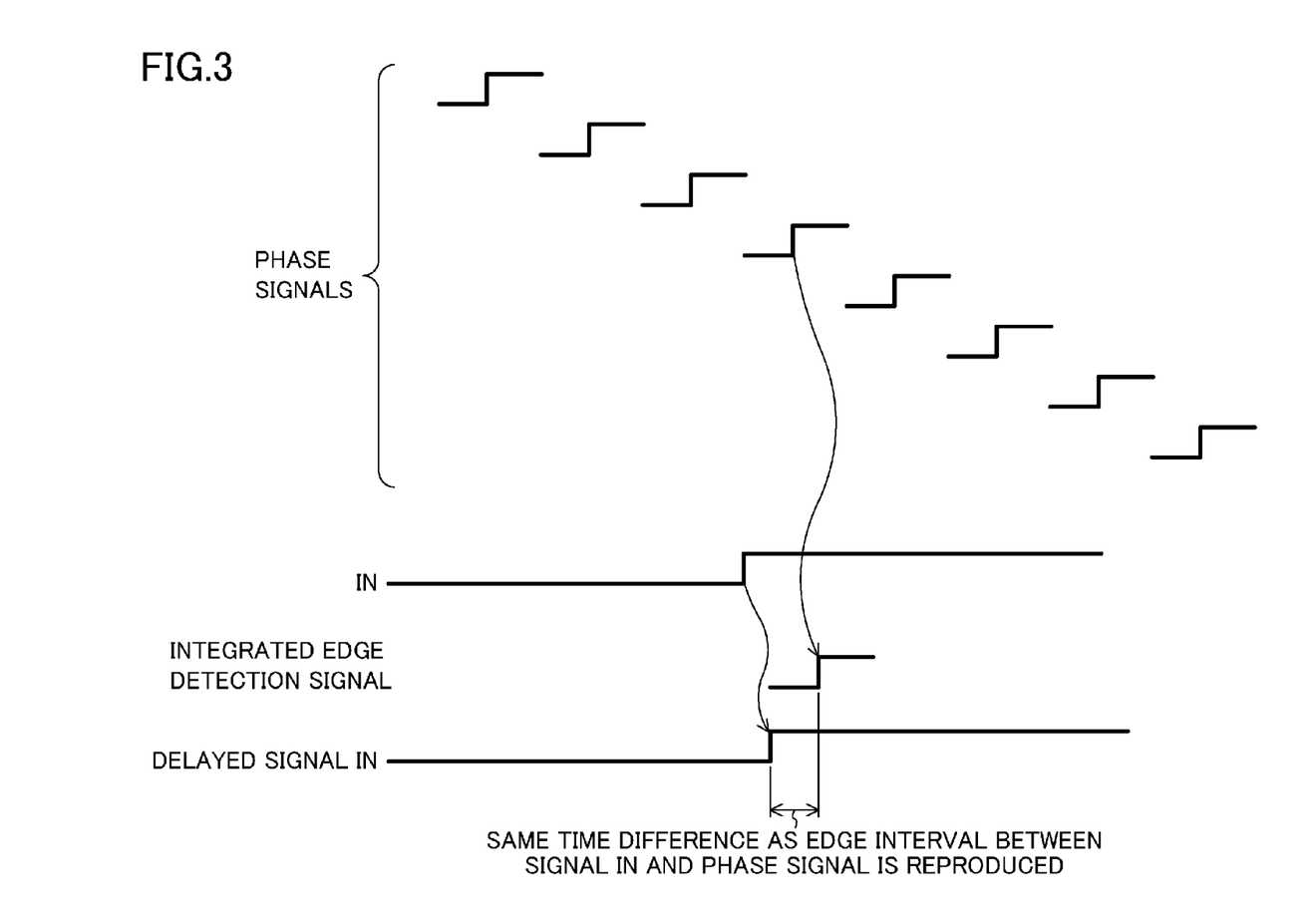
FIG. 3 is a timing chart of the edge detection unit having the configuration of FIG. 2.

The edge detection unit 2 receives a signal IN and a plurality of phase signals output from the ring oscillator 1, and detects the edge of one of the phase signals which occurs at the earliest after the timing of the edge of the signal IN. FIG. 2 shows an example configuration of the edge detection unit 2. FIG. 3 is an example timing chart of the edge detection unit 2. For example, the edge detection unit 2 includes a plurality of flip-flop units 21, a reset unit 22, and a logical operation unit 23. Specifically, the flip-flop units 21 are each a D flip-flop. A high-level signal is connected to the data input terminal of each flip-flop unit 21. The phase signals of the ring oscillator 1 are connected to the respective corresponding clock input terminals of the flip-flop units 21. An inverted version of the output signal of the reset unit 22 is connected to the reset input terminal of each flip-flop unit 21. The flip-flop units 21 each catch the edge of the corresponding phase signal which is received when the flip-flop unit 21 is in the reset canceled state, and output an individual edge detection signal.

The individual edge detection signals output from the flip-flop units 21 are input to the logical operation unit 23. Specifically, the logical operation unit 23 is a multiple-input OR gate. The logical operation unit 23 calculates the logical disjunction (logical OR) of the individual edge detection signals output from the flip-flop units 21, and outputs an integrated edge detection signal. Specifically, when any of the individual edge detection signals goes high, the integrated edge detection signal goes high.

The reset unit 22 cancels the reset states of the flip-flop units 21 at the timing of the edge of a signal IN, and after some short period of time has passed after the reset cancellation, resets the flip-flop units 21. Specifically, the reset unit 22 may be a circuit which outputs the negation of the logical disjunction (logical NOR) of the integrated edge detection signal of the logical operation unit 23 and an inverted version of a signal IN. By controlling the resetting of the flip-flop units 21 using an inverted version of the output signal of the reset unit 22, the reset states of the flip-flop units 21 are canceled at the timing of the edge of a signal IN, and the flip-flop units 21 are reset at the timing of the edge of the integrated edge detection signal.

In the edge detection unit 2 thus configured, even if a rising edge occurs in a phase signal before the timing of the edge of a signal IN, the rising edge does not cause a change in an individual edge detection signal. The edge of a phase signal which is input when the flip-flop unit 21 is in the reset canceled state after the timing of the edge of a signal IN emerges as the edge of an individual edge detection signal. By calculating the logical OR of the individual edge detection signals, one of the phase signals which occurs at the earliest after the timing of the edge of a signal IN can be detected.

Note that the logical operation unit 23 may be a multiple-input NAND gate which calculates the negation of the logical conjunction (logical NAND) of the inverted outputs of the flip-flop units 21. The reset unit 22 may be a pulse generation circuit which outputs a one-shot pulse having a pulse width similar to the inverter delay of the ring oscillator 1 using the timing of the edge of a signal IN as a trigger.

Figure 4:
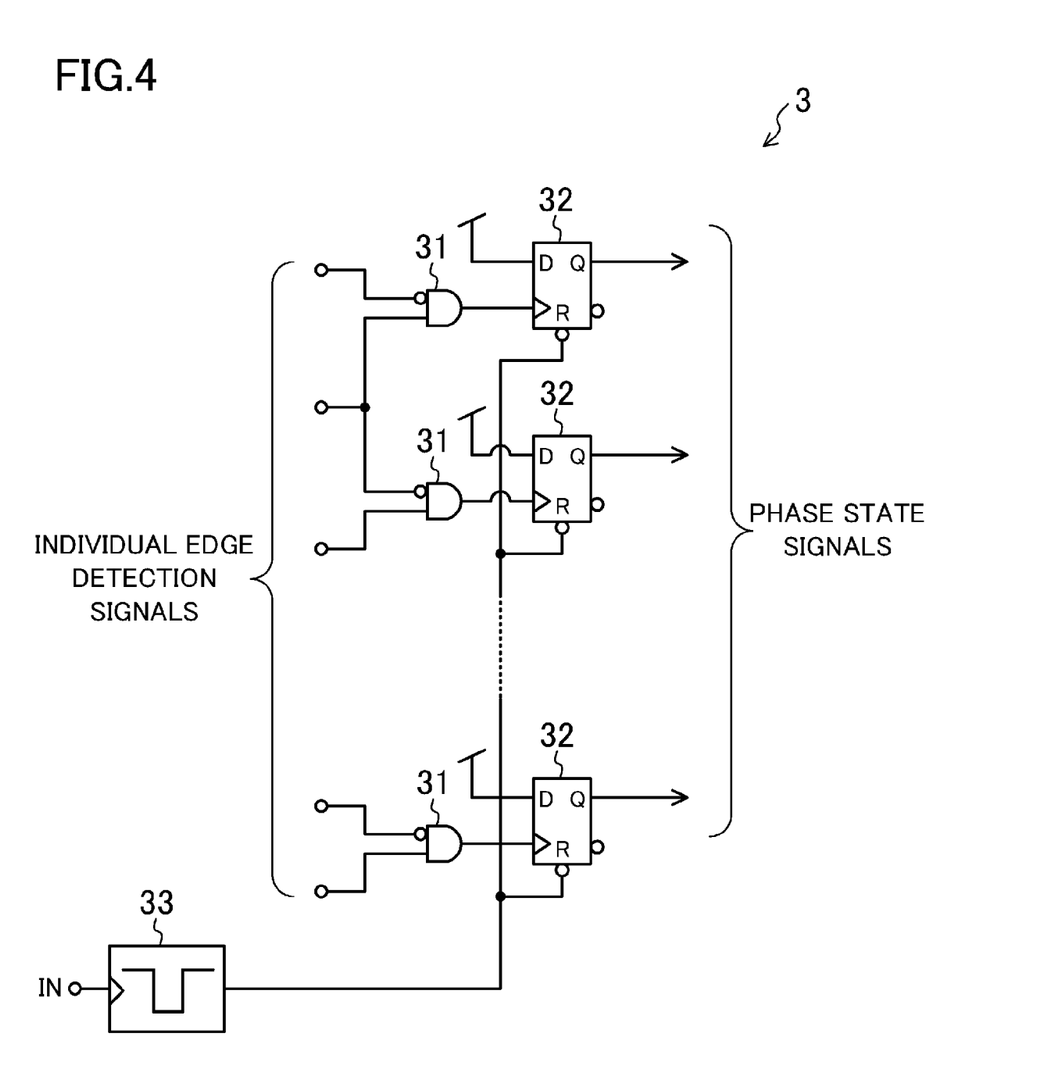
FIG. 4 is a diagram showing a configuration of an example phase state detection unit.

Referring back to FIG. 1, the phase state detection unit 3 detects the phase state of the ring oscillator 1 which occurs at the timing of the edge of a signal IN, based on the individual edge detection signals output from the flip-flop units 21 of the edge detection unit 2 (see FIG. 2). FIG. 4 shows an example configuration of the phase state detection unit 3. For example, the phase state detection unit 3 includes a plurality of logical operation units 31, a plurality of flip-flop units 32, and a reset unit 33. Specifically, the logical operation unit 31 is an AND gate. The logical operation unit 31 receives two individual edge detection signals having adjacent phases to calculate the logical AND of the "individual edge detection signal having the preceding phase" and an inverted version of the "individual edge detection signal having the following phase."

Specifically, the reset unit 33 is a pulse generation circuit which outputs a one-shot pulse using the timing of the edge of a signal IN as a trigger. Specifically, the flip-flop units 32 are each a D flip-flop. A high-level signal is connected to the data input terminals of the flip-flop units 32. The output signals of the logical operation units 31 are connected to the respective corresponding clock input terminals of the flip-flop units 32. An inverted version of the output signal of the reset unit 33 is connected to the reset input terminals of the flip-flop units 32. The flip-flop units 32 are in the reset canceled state during a period of time during which the reset unit 33 is outputting a one-shot pulse, and are in the reset state during the other period of time. The output signals of the flip-flop units 32 form a multiple-bit phase state signal which indicates the phase state of the ring oscillator 1 at the timing of the edge of a signal IN.

Here, one half of the output phase of the ring oscillator 1 is a rising edge, and the other half is a falling edge. Therefore, the phase state of the ring oscillator 1 can be detected by finding out a boundary between the rising and falling edges. As described above, a rising edge does not occur in an individual edge detection signal corresponding to a phase signal whose rising edge occurs before the timing of the edge of a signal IN. A rising edge occurs in an individual edge detection signal corresponding to a phase signal whose rising edge occurs after the timing of the edge of a signal IN. Therefore, if the flip-flop units 32 are set to the reset canceled state for a predetermined period of time after the timing of the edge of a signal IN, only the logical operation unit 31 which receives an individual edge detection signal having a rising edge as the "individual edge detection signal having the preceding phase" outputs a high-level signal, and only the flip-flop unit 32 which receives the high-level signal at the clock input terminal thereof outputs a high-level signal. Thereafter, based on the phase state signal, the phase state of the ring oscillator 1 at the timing of the edge of the signal IN can be detected.

Referring back to FIG. 1, the delay unit 4 delays an input signal IN and then outputs the delayed signal. The amount of a delay provided by the delay unit 4 is set to be similar to a gate delay caused by the flip-flop unit 21 and the logical operation unit 23 of the edge detection unit 2 (see FIG. 2). This is because, as shown in FIG. 3, the edge interval between a signal IN and a phase signal whose rising edge occurs immediately after the timing of the edge of the signal IN, is reproduced as the edge interval between the integrated edge detection signal output from the logical operation unit 23 and the output signal (delayed signal IN) of the delay unit 4.

The time-to-digital conversion unit 5 converts the edge interval between the integrated edge detection signal output from the logical operation unit 23 (see FIG. 2) and the output signal of the delay unit 4 into a digital value. In other words, the time-to-digital conversion unit 5 converts time information shorter than the inverter delay of the ring oscillator 1 into a digital value.

Note that the delay unit 4 may be removed. In this case, while an offset corresponding to the gate delay caused by the flip-flop unit 21 and the logical operation unit 23 is superposed on the time difference input to the time-to-digital conversion unit 5 (see FIG. 2), the offset can be canceled in the digital domain.

The counter unit 6 counts the number of cycles of an output signal which is any one of the phase signals output from the ring oscillator 1. The latch unit 7 latches the count value of the counter unit 6 at the timing of the edge of a signal IN. The latched count value represents time information which is longer than one period of the ring oscillator 1.

The operation unit 8 receives the output signals of the phase state detection unit 3, the time-to-digital conversion unit 5, and the latch unit 7, and calculates a digital value containing the output signal of the latch unit 7 in more significant bits, the output signal of the phase state detection unit 3 in intermediate significant bits, and the output signal of the time-to-digital conversion unit 5 in less significant bits. More specifically, the output signal of the output signal of the latch unit 7 and the output signal of the phase state detection unit 3 are added together as a value in upper places (orders of magnitude) and a value in lower places, respectively, and the output signal of the time-to-digital conversion unit 5 is subtracted as a value in lower places, to calculate the digital value. It is desirable that a value indicating the edge interval between a phase signal whose rising edge occurs immediately before the timing of the edge of a signal IN and the signal IN should be added as a value in the lowest places. However, the rising edge of a phase signal which occurs before the timing of the edge of a signal IN cannot be detected, and therefore, for the sake of convenience, a value indicating the edge interval between a signal IN and a phase signal whose rising edge occurs immediately after the timing of the edge of the signal IN is subtracted as a value in the lowest places. The operation unit 8 calculates the above digital value every time a signal IN is input to the time-to-digital converter, and calculates a difference between digital values which are calculated from two successively input signals IN, as the digital value OUT.

As described above, according to this embodiment, a time-to-digital converter can be provided which has an extended measurement range and an improved resolution.

Second Embodiment

Figure 5:
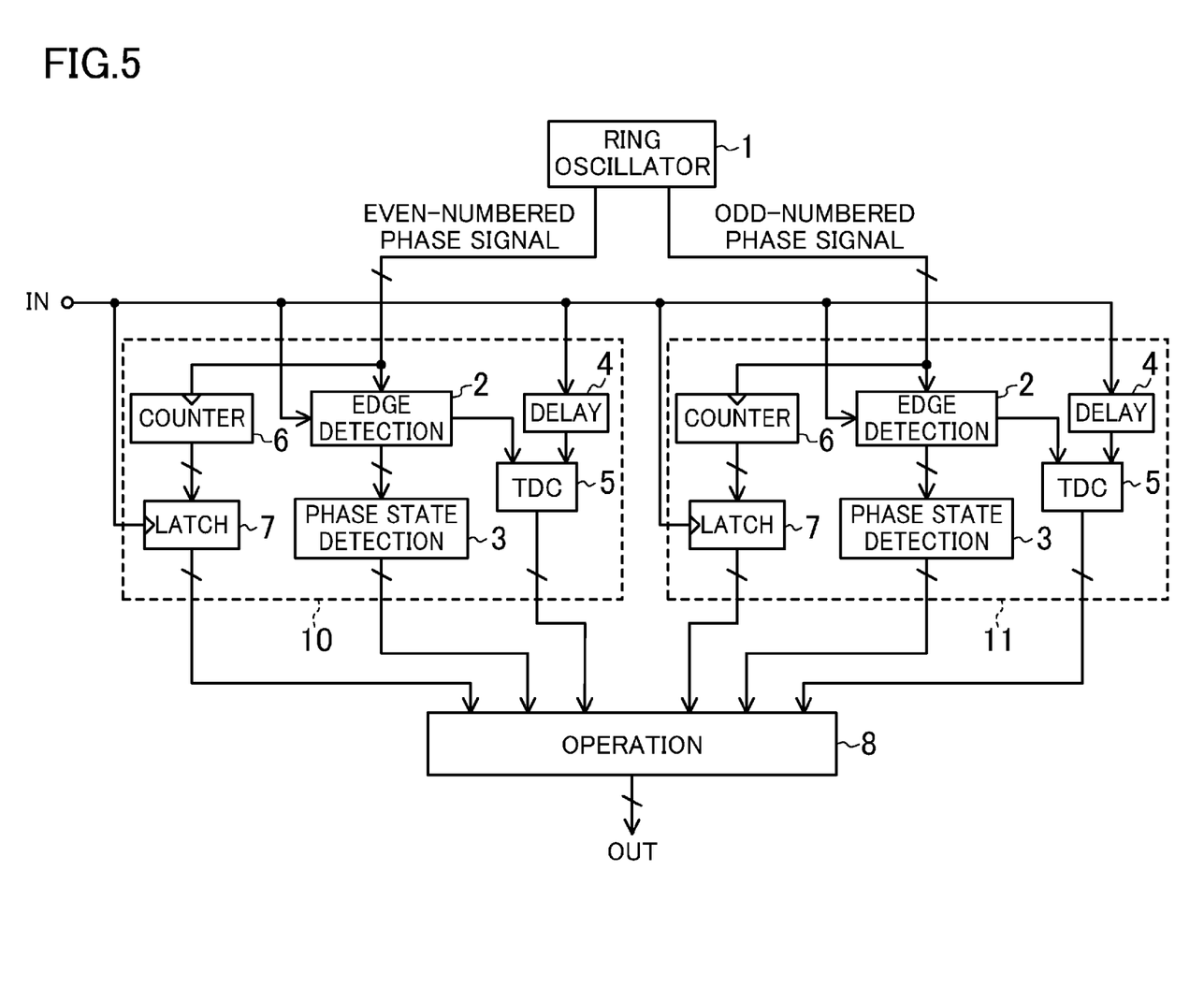
FIG. 5 is a diagram showing a configuration of a time-to-digital converter according to a second embodiment.

FIG. 5 shows a configuration of a time-to-digital converter according to a second embodiment. The time-to-digital converter of this embodiment includes a ring oscillator 1, an even-numbered phase measurement unit 10, an odd-numbered phase measurement unit 11, and an operation unit 8. A difference between the first and second embodiments will now be described.

The even-numbered and odd-numbered phase measurement units 10 and 11 each have a configuration similar to that of the first embodiment in that the above-described edge detection unit 2, phase state detection unit 3, delay unit 4, time-to-digital conversion unit 5, counter unit 6, and latch unit 7 are provided, and a signal IN is input. Note that a phase signal having an even-numbered phase output from the ring oscillator 1 is input to the even-numbered phase measurement unit 10, and a phase signal having an odd-numbered phase is input to the odd-numbered phase measurement unit 11. Specifically, even-numbered phase signals are input to the respective corresponding clock input terminals of the flip-flop units 21 (see FIG. 2) in the edge detection unit 2 of the even-numbered phase measurement unit 10, and odd-numbered phase signals are input to the respective corresponding clock input terminals of the flip-flop units 21 (see FIG. 2) in the edge detection unit 2 of the odd-numbered phase measurement unit 11. The counter unit 6 of the even-numbered phase measurement unit 10 and the counter unit 6 of the odd-numbered phase measurement unit 11 count the numbers of cycles of phase signals having different phases. For example, phase signals having phases which are different from each other by 180 degrees are input to the counter units 6 of the even-numbered and odd-numbered phase measurement units 10 and 11.

Figure 6:
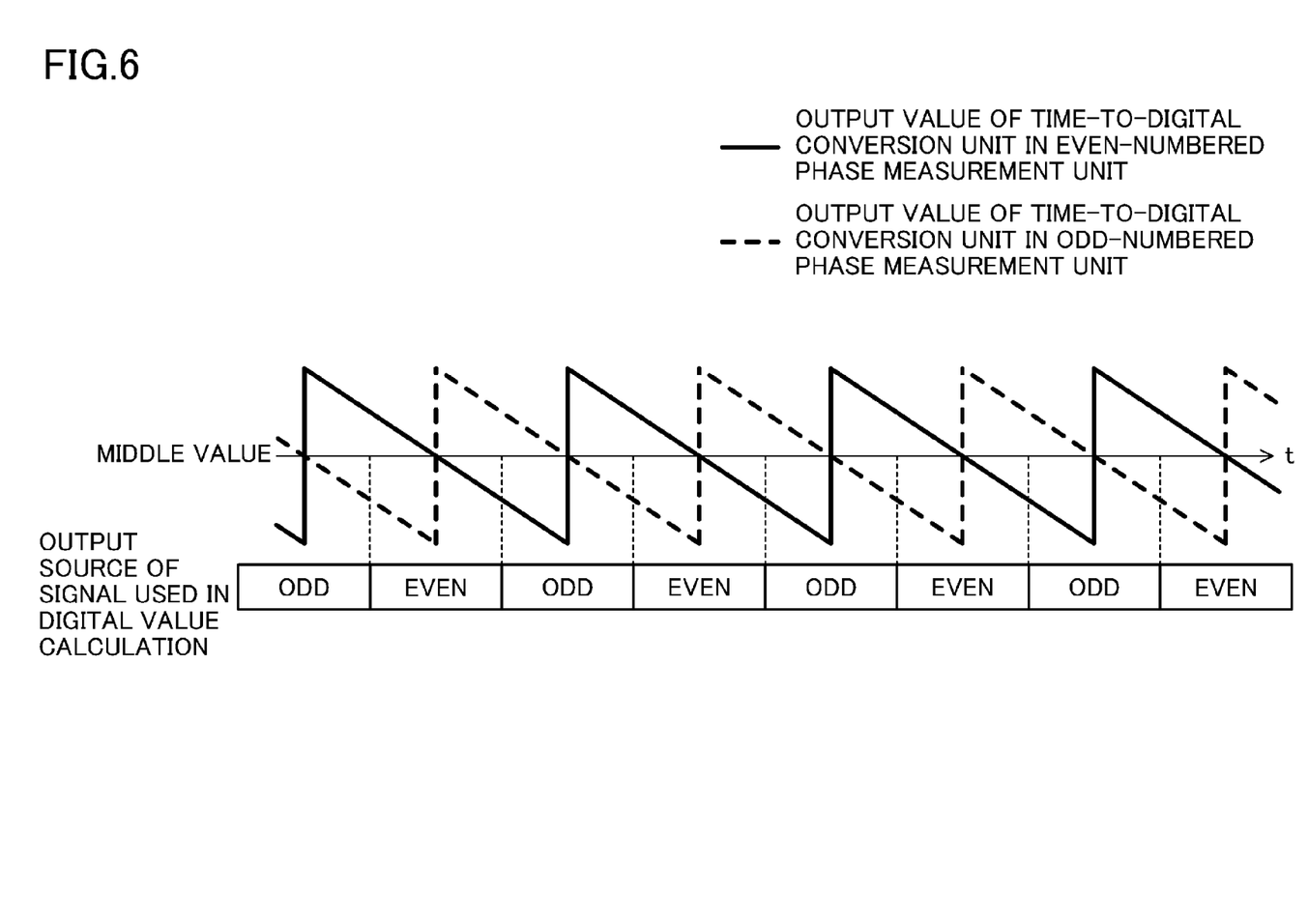
FIG. 6 is a diagram schematically showing how the output signal of a time-to-digital conversion unit in an even-numbered phase measurement unit and the output signal of a time-to-digital conversion unit in an odd-numbered phase measurement unit are selectively used.

The operation unit 8 calculates a digital value by selectively using signals output from the even-numbered phase measurement unit 10 and signals output from the odd-numbered phase measurement unit 11. FIG. 6 schematically shows how the output signal of the time-to-digital conversion unit 5 in the even-numbered phase measurement unit 10 and the output signal of the time-to-digital conversion unit 5 in the odd-numbered phase measurement unit 11 are selectively used. As described above, the time-to-digital conversion unit 5 converts the edge interval between a signal IN and a phase signal whose rising edge occurs immediately after the timing of the edge of the signal IN into a digital value. Therefore, as the delay of the timing of the edge of a signal IN increases, the edge interval becomes shorter, and the output value of the time-to-digital conversion unit 5 decreases. If the delay of the timing of the edge of a signal IN exceeds a predetermined amount, the phase signal to be compared is switched to a phase signal having the next phase, and therefore, the output value of the time-to-digital conversion unit 5 rapidly changes from the minimum value to the maximum value. This phase change alternately occurs between the even-numbered and odd-numbered phase measurement units 10 and 11. Therefore, the operation unit 8 calculates a digital value using one of the output signal of the time-to-digital conversion unit 5 in the even-numbered phase measurement unit 10 and the output signal of the time-to-digital conversion unit 5 in the odd-numbered phase measurement unit 11, that is closer to the middle value, and a phase state signal corresponding to that output signal. As a result, the digital value can be stably calculated while avoiding the timing when the output value of the time-to-digital conversion unit 5 rapidly changes.

Figure 7:
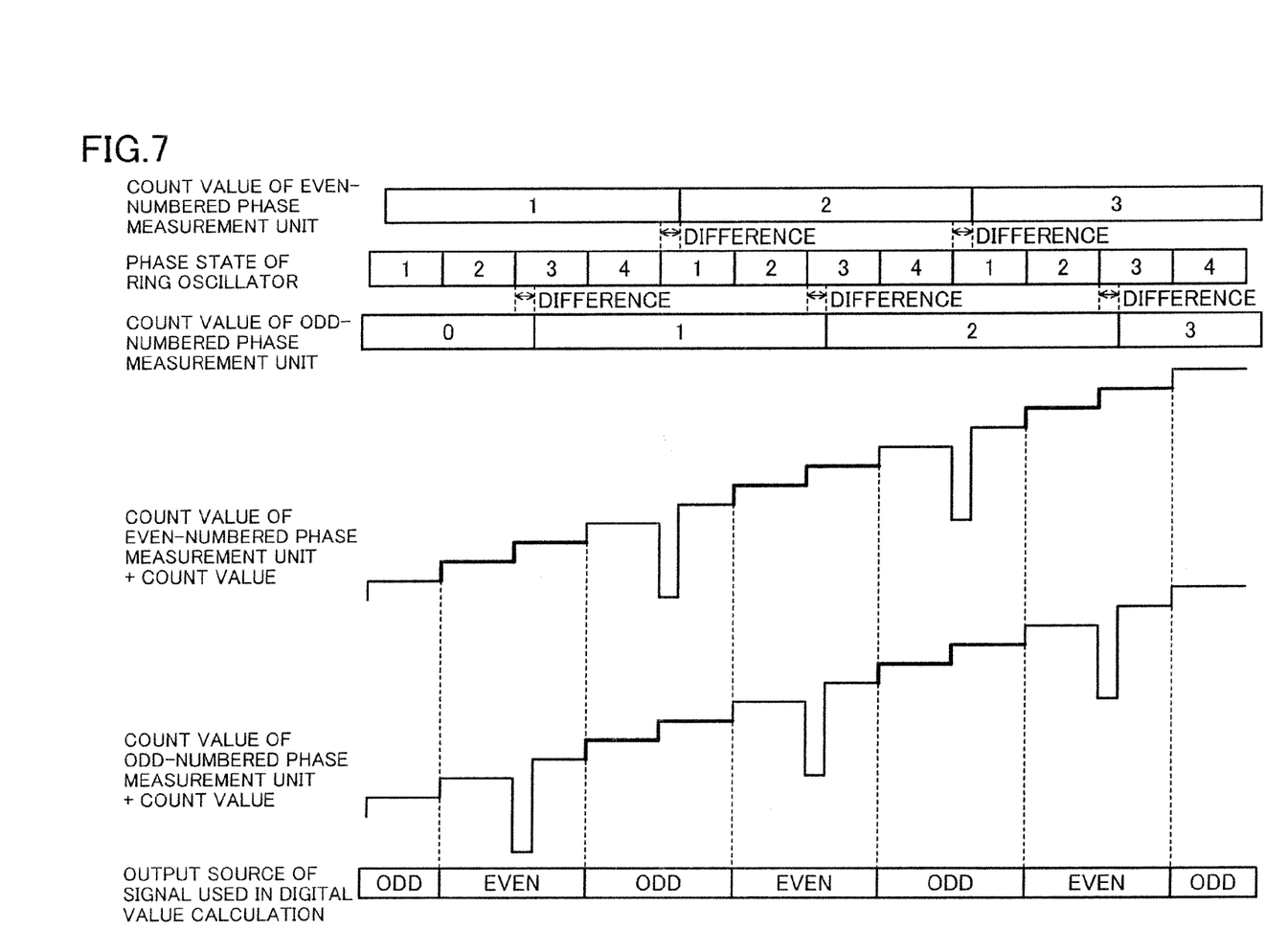
FIG. 7 is a diagram schematically showing how a count value of the even-numbered phase measurement unit and a count value of the odd-numbered phase measurement unit are selectively used.

FIG. 7 schematically shows how the count value of the even-numbered phase measurement unit 10 and the count value of the odd-numbered phase measurement unit 11 are selectively used. As shown in FIG. 7, the timing when the count values of the even-numbered and odd-numbered phase measurement units 10 and 11 change and the timing when the phase state of the ring oscillator 1 change may have slightly different phases. Therefore, the digital value is likely to be incorrectly calculated before and after the timing of the change of the count value. Therefore, the operation unit 8 calculates the digital value using one of the count value of the even-numbered phase measurement unit 10 and the count value of the odd-numbered phase measurement unit 11, that is closer to the middle of the count period. The middle of the count period may be found out, for example, by measuring one period of the counter unit 6 at intervals which are sufficiently shorter than one period of the counter unit 6. As a result, the digital value can be stably calculated while avoiding a portion where the timing of the change of the count value and the timing of the phase state of the ring oscillator 1 do not have the same phase.

Third Embodiment

Figure 8:
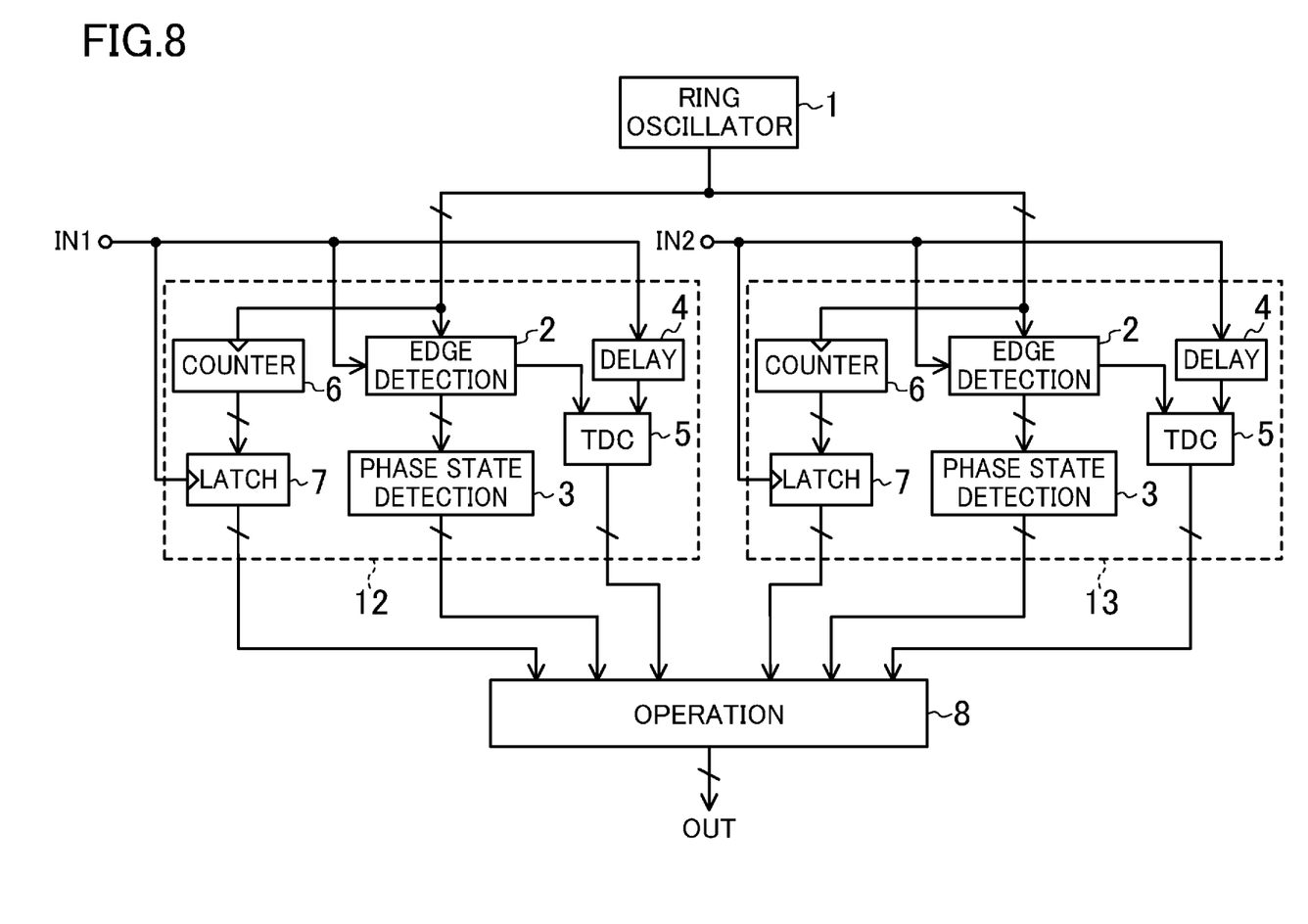
FIG. 8 is a diagram showing a configuration of a time-to-digital converter according to a third embodiment.

FIG. 8 shows a configuration of a time-to-digital converter according to a third embodiment. The time-to-digital converter of this embodiment includes a ring oscillator 1, a first phase measurement unit 12, a second phase measurement unit 13, and an operation unit 8. A difference between the first and third embodiments will now be described.

The first and second phase measurement units 12 and 13 have a configuration similar to that of the first embodiment in that the above-described edge detection unit 2, phase state detection unit 3, delay unit 4, time-to-digital conversion unit 5, counter unit 6, and latch unit 7 are provided. Note that a signal IN1 is input to the first phase measurement unit 12, and a signal IN2 is input to the second phase measurement unit 13. The operation unit 8 calculates a digital value representing the timing of the edge of the signal IN1 from signals output from the first phase measurement unit 12, and a digital value representing the timing of the edge of the signal IN2 from signals from the second phase measurement unit 13, and calculates a difference between these digital values as a digital value OUT.

In the time-to-digital converter of the first embodiment, when the edge interval between two successively input signals IN is shorter than the data throughput of the time-to-digital converter, time-to-digital conversion is unlikely to be correctly performed. In contrast to this, the time-to-digital converter of this embodiment includes two phase measurement units each of which include the edge detection unit 2, the phase state detection unit 3, the delay unit 4, the time-to-digital conversion unit 5, the counter unit 6, and the latch unit 7. Therefore, the time-to-digital converter of this embodiment can calculate digital values representing the signals IN1 and IN2 independently. Therefore, even when the edge interval between the signals IN1 and IN2 is short, time-to-digital conversion can be correctly performed.

Fourth Embodiment

Figure 9:
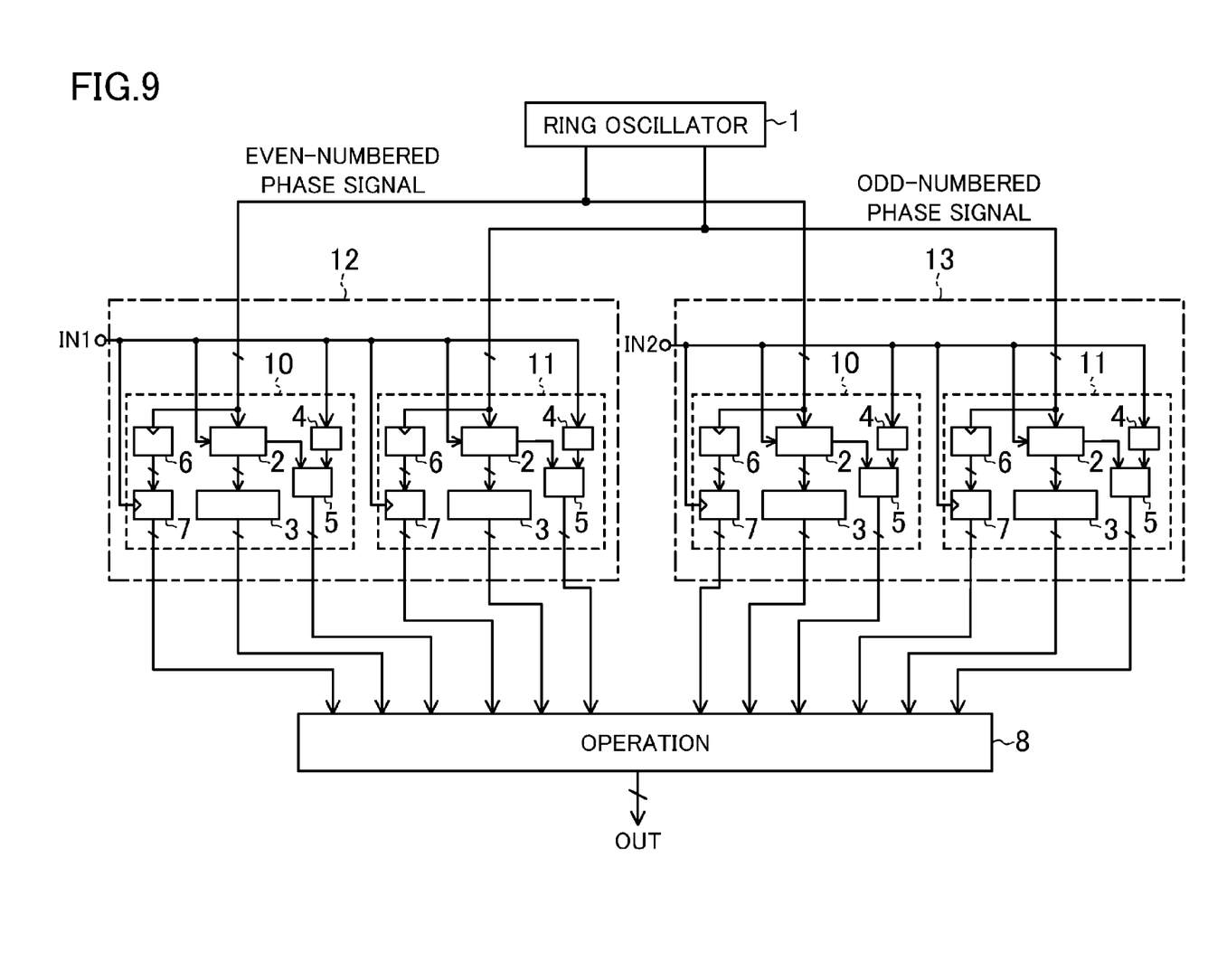
FIG. 9 is a diagram showing a configuration of a time-to-digital converter according to a fourth embodiment.

FIG. 9 shows a configuration of a time-to-digital converter according to a fourth embodiment. In the time-to-digital converter of this embodiment, the first and second phase measurement units 12 and 13 of the time-to-digital converter of the third embodiment each include the even-numbered and odd-numbered phase measurement units 10 and 11 as in the second embodiment. In this embodiment, the advantages of the second and third embodiments allow for more stable conversion of a shorter edge interval into a digital value.

Fifth Embodiment

Figure 10:
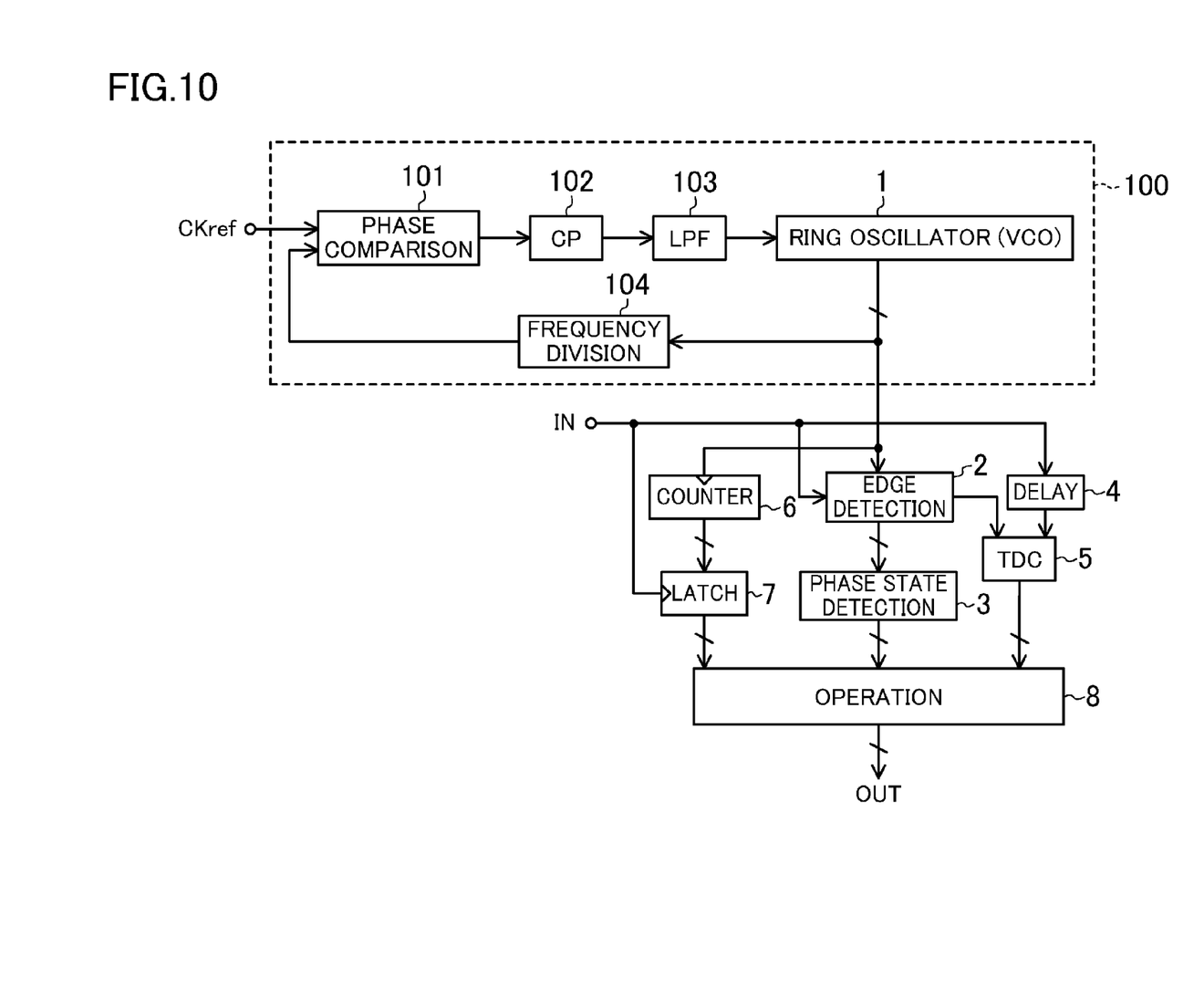
FIG. 10 is a diagram showing a configuration of a time-to-digital converter according to a fifth embodiment.

FIG. 10 shows a configuration of a time-to-digital converter according to a fifth embodiment. The time-to-digital converter of this embodiment is the time-to-digital converter of the first embodiment in which a voltage-controlled oscillator of a phase-locked loop (PLL) 100 is used as the ring oscillator 1. The PLL 100 includes a phase comparison unit 101, a charge pump circuit 102, a loop filter 103, a frequency division circuit 104, and the ring oscillator 1 as a voltage-controlled oscillator. The frequency division circuit 104 divides the frequency of the output signal of the ring oscillator 1. The phase comparison unit 101 compares the phase of a reference clock signal CKref with the phase of the output signal of the frequency division circuit 104. The charge pump circuit 102 outputs a charge current, depending on the output signal of the phase comparison unit 101. The loop filter 103 performs a filtering process on the charge current to generate a control voltage for the ring oscillator 1.

In this embodiment, the oscillation frequency of the ring oscillator 1 is stabilized to an integral multiple of the frequency of CKref, and therefore, the conversion accuracy of the time-to-digital converter can be improved. Note that, in the time-to-digital converters of the second to fourth embodiments, the voltage-controlled oscillator of the PLL 100 can be used as the ring oscillator 1.

As described above, the first to fifth embodiments have been described as example techniques disclosed in the present application. However, the techniques according to the present disclosure are not limited to these embodiments, but are also applicable to those where modifications, substitutions, additions, and omissions are made. In addition, elements described in the first to fifth embodiments may be combined to provide a different embodiment.

Various embodiments have been described above as example techniques of the present disclosure, in which the attached drawings and the detailed description are provided.

As such, elements illustrated in the attached drawings or the detailed description may include not only essential elements for solving the problem, but also non-essential elements for solving the problem in order to illustrate such techniques. Thus, the mere fact that those non-essential elements are shown in the attached drawings or the detailed description should not be interpreted as requiring that such elements be essential.

Since the embodiments described above are intended to illustrate the techniques in the present disclosure, it is intended by the following claims to claim any and all modifications, substitutions, additions, and omissions that fall within the proper scope of the claims appropriately interpreted in accordance with the doctrine of equivalents and other applicable judicial doctrines.

What is claimed is:

1. A time-to-digital converter for converting an edge interval of an input signal into a digital value, comprising:
    a ring oscillator;
    an edge detection unit including a plurality of flip-flop units configured to receive a plurality of phase signals, respectively, obtained by equally dividing the oscillation period of the ring oscillator, at the respective clock input terminals thereof, a reset unit configured to cancel reset states of the plurality of flip-flop units at the timing of an edge of the input signal and reset the plurality of flip-flop units thereafter, and a logical operation unit configured to perform a logical operation on output signals of the plurality of flip-flop units;
    a phase state detection unit configured to detect a phase state of the ring oscillator occurring at the timing of the edge of the input signal based on the output signals of the plurality of flip-flop units;
    a time-to-digital conversion unit configured to convert an edge interval between the input signal and an output signal of the logical operation unit into a digital value;
    a counter unit configured to count the number of cycles of an output signal of the ring oscillator;
    a latch unit configured to latch a count value of the counter unit at the timing of the edge of the input signal; and
    an operation unit configured to calculate a first and a second digital value each containing an output signal of the latch unit in more significant bits, an output signal of the phase state detection unit in intermediate significant bits, and an output signal of the time-to-digital conversion unit in less significant bits, for a first and a second input signal, respectively, successively input to the time-to-digital converter, and calculate a difference between the digital values.

2. The time-to-digital converter of claim 1, further comprising:
    an even-numbered and an odd-numbered phase measurement unit each including the edge detection unit, the phase state detection unit, the time-to-digital conversion unit, the counter unit, and the latch unit, wherein
    phase signals having even-numbered phases of the ring oscillator are input to the respective corresponding clock input terminals of the plurality of flip-flop units of the edge detection unit included in the even-numbered phase measurement unit,
    phase signals having odd-numbered phases of the ring oscillator are input to the respective corresponding clock input terminals of the plurality of flip-flop units of the edge detection unit included in the odd-numbered phase measurement unit,
    the counter units included in the even-numbered and odd-numbered phase measurement units count the numbers of cycles of phase signals having different phases of the ring oscillator, and
    the operation unit calculates the first and second digital values by selectively using signals output from the even-numbered phase measurement unit and signals output from the odd-numbered phase measurement unit.

3. The time-to-digital converter of claim 2, further comprising:
    a first and a second phase measurement unit each including the even-numbered and odd-numbered phase measurement units, and configured to receive the first and second input signals, respectively,
wherein
    the operation unit calculates the first digital value by selectively using signals output from the even-numbered phase measurement unit included in the first phase measurement unit and signals output from the odd-numbered phase measurement unit included in the first phase measurement unit, and calculates the second digital value by selectively using signals output from the even-numbered phase measurement unit included in the second phase measurement unit and signals output from the odd-numbered phase measurement unit included in the second phase measurement unit.

4. The time-to-digital converter of claim 1, further comprising:
    a first and a second phase measurement unit each including the edge detection unit, the phase state detection unit, the time-to-digital conversion unit, the counter unit, and the latch unit, and configured to receive the first and second input signals, respectively, wherein
    the operation unit calculates the first digital value from signals output from the first phase measurement unit, and the second digital value from signals output from the second phase measurement unit.

5. The time-to-digital converter of claim 1, wherein the ring oscillator is a voltage-controlled oscillator of a phase-locked loop (PLL).

* * * * *